US009133560B2

(12) United States Patent
Daviot et al.

(10) Patent No.: US 9,133,560 B2
(45) Date of Patent: Sep. 15, 2015

(54) ELECTROPLATING COMPOSITION FOR COATING A SUBSTRATE SURFACE WITH A METAL

(75) Inventors: Jérôme Daviot, Leuven (BE); José Gonzalez, Paris (FR)

(73) Assignee: ALCHIMER, Massy (FR)

( * ) Notice: Subject to any disclaimer, the term of this patent is extended or adjusted under 35 U.S.C. 154(b) by 1012 days.

(21) Appl. No.: 11/992,323

(22) PCT Filed: Sep. 20, 2006

(86) PCT No.: PCT/FR2006/050914
§ 371 (c)(1),
(2), (4) Date: Mar. 11, 2009

(87) PCT Pub. No.: WO2007/034116
PCT Pub. Date: Mar. 29, 2007

(65) Prior Publication Data
US 2009/0183993 A1     Jul. 23, 2009

Related U.S. Application Data

(63) Continuation-in-part of application No. 11/266,799, filed on Nov. 4, 2005, now abandoned.

(30) Foreign Application Priority Data

Sep. 20, 2005    (FR) ..................................... 05 09571

(51) Int. Cl.
*C25D 3/38*     (2006.01)
*C25D 5/54*     (2006.01)
(Continued)

(52) U.S. Cl.
CPC .. *C25D 5/54* (2013.01); *C25D 3/38* (2013.01); *C25D 5/34* (2013.01); *C25D 7/123* (2013.01); *H01L 21/2885* (2013.01); *H01L 21/76873* (2013.01)

(58) Field of Classification Search
CPC ......................................................... C25D 3/38
USPC ......................................... 205/118, 291, 296
See application file for complete search history.

(56) References Cited

U.S. PATENT DOCUMENTS 4,009,087 A * 2/1977 Kardos et al. ................. 205/298
5,302,278 A     4/1994 Nobel et al.
(Continued)

FOREIGN PATENT DOCUMENTS

JP    01-219187 A    9/1989
JP    05-230687    8/1993
(Continued)

OTHER PUBLICATIONS

Rosenberg et al., "Copper Metallization for High Performance Silicon Technology," Ann. Rev. Mater. Sci (2000), 30, pp. 229-262.
(Continued)

*Primary Examiner* — Edna Wong
*Assistant Examiner* — Louis Rufo
(74) *Attorney, Agent, or Firm* — Hamre, Schumann, Mueller & Larson, P.C.

(57) ABSTRACT

The object of the present invention is an electroplating composition intended in particular for coating a copper-diffusion barrier layer with a seed layer, This composition comprises a source of copper ions, in a concentration of between 0.4 and 40mM; at least one copper complexing agent chosen from the group of primary aliphatic amines, secondary aliphatic amines, tertiary aliphatic amines, aromatic amines, nitrogen heterocycles and oximes; the copper/complexing agent(s) molar ratio being between 0.1 and 2.5, preferably between 0.3 and 1.3; and the pH of the composition being less than 7, preferably between 3.5 and 6.5.

12 Claims, 2 Drawing Sheets

(51) Int. Cl.
*C25D 5/34* (2006.01)
*H01L 21/288* (2006.01)
*H01L 21/768* (2006.01)
*C25D 7/12* (2006.01)

(56) References Cited

U.S. PATENT DOCUMENTS

| | | | |
|---|---|---|---|
| 5,969,422 | A | 10/1999 | Ting et al. |
| 6,309,969 | B1 | 10/2001 | Oskam et al. |
| 6,323,121 | B1 | 11/2001 | Liu et al. |
| 6,409,903 | B1 | 6/2002 | Chung et al. |
| 6,551,484 | B2 | 4/2003 | Hey et al. |
| 6,806,186 | B2 | 10/2004 | Chen et al. |
| 6,811,675 | B2 | 11/2004 | Chen |
| 6,893,550 | B2 | 5/2005 | Dubin et al. |
| 6,897,152 | B2 | 5/2005 | Verbunt |
| 2001/0001081 | A1* | 5/2001 | Oskam et al. ............... 438/687 |
| 2001/0042689 | A1 | 11/2001 | Chen |
| 2003/0155247 | A1 | 8/2003 | Miura et al. |
| 2004/0206628 | A1 | 10/2004 | Lubomirsky et al. |
| 2005/0006245 | A1 | 1/2005 | Sun et al. |
| 2005/0020068 | A1* | 1/2005 | Wang et al. ............... 438/687 |
| 2005/0175780 | A1* | 8/2005 | Sparing et al. ............. 427/307 |
| 2005/0199502 | A1 | 9/2005 | Andricacos et al. |
| 2005/0274622 | A1 | 12/2005 | Sun et al. |
| 2006/0065537 | A1 | 3/2006 | Barstad et al. |
| 2007/0062817 | A1 | 3/2007 | Monchoix et al. |
| 2007/0062818 | A1 | 3/2007 | Daviot et al. |

FOREIGN PATENT DOCUMENTS

| | | |
|---|---|---|
| JP | 2000-273684 | 10/2000 |
| JP | 2002-180259 A | 6/2002 |

OTHER PUBLICATIONS

Chen et al., "ECD Seed Layer for Inlaid Cooper Metallisation," Semiconductor Fabtech, 12$^{th}$ edition, Feb. 3, 2005, Abstract only.

Van Horn, "Pulse Plating," Dynatronix, Aug. 5, 1999, pp. 1-13.

French Search Report, dated May 12, 2006, from parent U.S. Appl. No. 11/266,799.

* cited by examiner

ELECTROPLATING COMPOSITION FOR COATING A SUBSTRATE SURFACE WITH A METAL

This application is a continuation-in-part application of the application Ser. No. 11/266,799 filed Nov. 4, 2005 and also a U.S. national stage application of the international application number PCT/FR2006/050914 filed Sep. 20, 2006. The PCT/FR2006/050914 application and the 11/266,799 application are incorporated herein by reference.

Electroplating composition intended for coating a surface of a substrate with a metal.

BACKGROUND OF INVENTION

The present invention relates in general to an electroplating composition intended for coating a surface of a substrate with copper, especially a surface consisting of an electrically resistive material, in particular for the coating of a copper-diffusion barrier layer.

The invention is especially applicable in the field of microelectronics for the fabrication of interconnects in integrated circuits. It is also applicable in other fields of electronics, for the fabrication of inter-connects in printed circuits (called printed circuit boards or printed wire boards) or for the fabrication of passive elements, such as inductors, or in the electromechanical field in integrated circuits or in microsystems (called microelectromechanical systems).

The term "electroplating" is understood here to mean a method of covering a surface of a substrate with a metallic or organometallic coating, in which the substrate is electrically biased and brought into contact with a liquid that contains precursors of the said metallic or organometallic coating, so as to form the said coating. When the substrate is an electrical conductor, the electroplating is for example carried out by passing a current between the substrate to be coated which constitutes an electrode (the cathode in the case of a metallic or organometallic coating) and a second electrode (the anode) in a bath containing a source of precursors of the coating material (for example metal ions in the case of a metallic coating) and optionally various agents intended to improve the properties of the formed coating (uniformity and fineness of the deposit, resistivity, etc.), optionally with a reference electrode being present. By international convention, the current flowing through and the voltage applied to the substrate of interest, that is to say the cathode of the electrochemical circuit, are negative. Throughout this text, when these currents and voltages are mentioned with a positive value, it is implicit that this value represents the absolute value of the said current or the said voltage.

Copper electroplating is used in particular in the microelectronics field for the fabrication of interconnects in integrated circuits. The good electrical conductivity of copper and its high resistance to the phenomenon of electromigration, that is to say the low migration of copper atoms under the effect of the electric current density that can be responsible to significantly deform the conductor and be a major cause of failure, makes it in particular a material of choice for the fabrication of metal interconnects for integrated circuits of increasingly smaller etched features.

Integrated circuits are generally fabricated by forming active semiconductor devices, especially transistors, on the surface of silicon wafers, the said semiconductor devices being connected together by a system of metal interconnects consisting of "lines" and "contacts", also called "vias", placed in superimposed levels and obtained by respectively filling "trenches" and "wells" also called "interconnection holes", made in the dielectric layers.

Since copper is difficult to etch and has a high diffusivity in many materials, the interconnects are generally produced by a sequence of steps comprising:
  deposition of an insulating dielectric layer;
  etching of the interconnect features in the said dielectric layer;
  deposition of a barrier layer (generally made of tantalum, titanium nitride, tantalum nitride, tungsten nitride or tungsten carbide, for example) used to prevent copper migration;
  filling of the lines and interconnection holes with copper; and
  removal of the excess copper by chemical mechanical polishing.

This sequence of steps is known by the name "Damascene process", which has been described for example by C. Y. Chang and S. M. Sze "ULSI Technology", McGraw-Hill, New York, (1996), pages 444-445.

The barrier layer generally has too high a resistance for copper to be electrochemically deposited homogeneously or uniformly at the wafer scale, an effect known to those skilled in the art by the term "ohmic drop". The high resistance of the barrier layer results both from the high resistivity of its constituent materials (generally metal nitrides) and from its small thickness (generally from a few nm to a few tens of nm, depending on the integrated circuit generation), which thickness is imposed by the small size of the interconnect features.

Consequently, it is generally necessary, prior to the copper electroplating step, to cover the barrier layer—using a non-electrochemical method—with a thin layer of metallic copper, called a seed layer. This seed layer, like the barrier layer, is currently produced by vapor phase deposition techniques such as PVD (physical vapor deposition) or CVD (chemical vapor deposition).

owing to the critical dimensions of the lines and interconnection holes of current integrated circuits, and their trend towards ever smaller dimensions, the thickness of the copper seed layers at the present time is around 30 nm and should rapidly move towards 10 nm or less.

CVD deposition produces a conformal copper layer, that is to say one that accurately matches the topography of the surface to be coated, and does so for a wide range of aspect ratios. However, the adhesion to the diffusion barriers of the copper layers formed by chemical deposition is poor. This limits in practice the benefit of this type of process since strong adhesion between the copper and the barrier is required in order to ensure reliability of the structures constituting the interconnects.

In addition, processes using chemical vapor deposition are relatively expensive because of the high cost of the consumables (the precursors), of the equipment needed to implement them and their low efficiency.

PVD deposition is presently preferred from the industrial standpoint because it allows surfaces having a high resistance to be coated with better adhesion of the copper to the barrier than obtained with CVD processes.

The thickness of the coating deposited by PVD is directly proportional to the solid angle seen from the surface to be coated. Consequently, those portions of the surface having salient angles are covered with a thicker layer than those portions of the surface having re-entrant angles. As a result, the copper seed layers formed by physical vapor deposition are not conformal, and therefore do not have a uniform thickness at every point on the surface of the substrate. In particular, shadow or overhang effects are observed at the sharp edges of trenches or vias, up to the point of obstructing their apertures and then making it impossible to fill them. Moreover, the sidewalls of the trenches and vias may be covered with an insufficient thickness of the seed layer, which then results in imperfect subsequent filling, missing material or voids. In addition, the seed layer produced on the sidewalls of the features exhibits by nature an adhesion that differs from that deposited on the flat surface of the substrate (at the top and bottom of the trenches and vias). This may lead to inferior reliability properties, such as resistance to electromigration. In other words, the non-conformal coverage does not solely result in differences in thickness as lack of continuity and poor adhesion of the layer on the sidewalls of the trenches and vias may also arise therefrom.

These limitations make it very tricky to use PVD technology in advanced generation integrated circuits with very small dimensions of the trenches and vias (of the order of a few tens of nanometers) and very high aspect ratios.

In this context, the electroplating technique presented here constitutes an advantageous alternative to chemical vapor deposition or physical vapor deposition processes, and to the more conventional metal electroplating techniques, which cannot be implemented on resistive substrates.

This is because conventional electroplating, which consists in applying in general a DC current to the substrate immersed in a bath containing metal ions, can be applied only to surfaces that are sufficiently conducting, that is to say typically having a sheet resistance of less than about a few ohms/square, which is not the case for the layers forming a copper-diffusion barrier in the most advanced technologies, the sheet resistance of which is commonly a few tens of ohms/square to several hundred ohms/square and may be several tens of thousands of ohms/square.

Sheet resistance is a quantity used by those skilled in the art for measuring electrical resistance of thin films or layers. It is expressed in ohms/square and is equivalent to the resistivity for a two-dimensional system, that is to say one in which the current flows in the plane of the layer and not in a plane perpendicular to this layer. Mathematically, the value of the sheet resistance is obtained by dividing the resistivity (expressed in ohms.m or microohms.cm) of the constituent material of the layer by the thickness (expressed in m or nm) of this layer.

At the present time, conventional copper electroplating is mainly used for filling the trenches and wells in the damascene process by applying a DC current to a wafer covered beforehand with a seed layer and immersed in an acid copper sulphate bath containing additives. This process for filling the trenches and wells with metallic copper is described for example by Rosenberg et al., in "Copper metallization for high performance silicon technology", Ann. Rev. Mater. Sci (2000), 30, 229-62.

The use of copper electroplating on a copper seed layer for filling trenches and wells has also been described in U.S. Pat. No. 6,893,550 incorporated herein by reference.

The electroplating method described in document U.S. Pat. No. 6,893,550 is essentially characterized:
- on the one hand, in that it makes use of an electroplating bath whose specific chemical composition comprises at least one acid, preferably sulphuric acid, at least one halide ion, preferably chloride, and a combination of chemical agents capable of accelerating or suppressing formation of the coating; and
- on the other hand, in that it consists in modifying the density of the current applied in predetermined sequences.

Copper electroplating has also been recommended, for example in U.S. Pat. No. 6,811,675, for filling any voids in the seed layer or for repairing this layer (seed repair or seed enhancement).

In a preferred embodiment described in this prior document, a first step is carried out, preferably by a physical vapor deposition process, in which a non-uniform "ultrathin" (thickness of about 20 nm) copper seed layer is deposited and then in a second step the conformality of the layer is improved by electroplating using an alkaline electroplating solution (the pH of which is greater than 9) containing copper sulphate, a copper complexing agent, preferably citric acid, and optionally boric acid in order to improve the brightness of the coating and/or ammonium sulphate for reducing the resistivity of the coating. The current density applied during electroplating is between 1 mA/cm$^2$ and 5 mA/cm$^2$.

It is indicated in the above prior document that this electroplating process may also be used to produce a copper seed layer, but this possibility is not illustrated by any example and it appears not to be easily achievable owing to the high current densities mentioned in that document.

BRIEF SUMMARY OF THE INVENTION

In this situation, the object of the present invention is to solve a new technical problem, namely of how to provide a novel electroplating composition which makes it possible in particular to produce continuous and conformal copper seed layers having a thickness of the order of 10 nm or less and exhibiting excellent adhesion to diffusion barriers that may have a high surface resistance of up to a few megohms/square.

The solution according to the present invention for solving this technical problem consists of an electroplating composition intended in particular for coating a copper-diffusion barrier layer in the fabrication of interconnects for integrated circuits, characterized in that it comprises, in solution in a solvent:
- a source of copper ions, in a concentration of between 0.4 and 40 mM, preferably of between 0.4 and 18 mM and more preferably of between 0.4 and 15 mM;
- at least one copper complexing agent chosen from the group comprising primary aliphatic amines, secondary aliphatic amines, tertiary aliphatic amines, aromatic amines, nitrogen heterocycles and oximes;
- the copper/complexing agent(s) molar ratio being between 0.1 and 2.5, preferably between 0.3 and 1.3; and
- the pH of the said composition being less than 7, preferably between 3.5 and 6.5.

It has been discovered, and this constitutes the basis of the present invention, that a number of copper complexing agents containing at least one nitrogen atom used in acid medium, that is to say at a pH of less than 7, provide particularly remarkable copper electroplating compositions that can be used for the fabrication of continuous and conformal copper seed layers directly on diffusion barrier surfaces such as those employed in the fabrication of integrated circuit interconnects.

This discovery is all the more surprising as a person skilled in the art knows that compounds containing a nitrogen atom, in particular amines, may be protonated in acidic medium, thus losing their capability of forming complexes with copper. Very surprisingly it has thus been found that copper is deposited on a barrier layer much more satisfactorily in acid medium in which the proportion of complexed copper is a priori lower than in basic medium, as recommended in the prior art.

DETAILED DESCRIPTION OF THE INVENTION

Figure 1A:
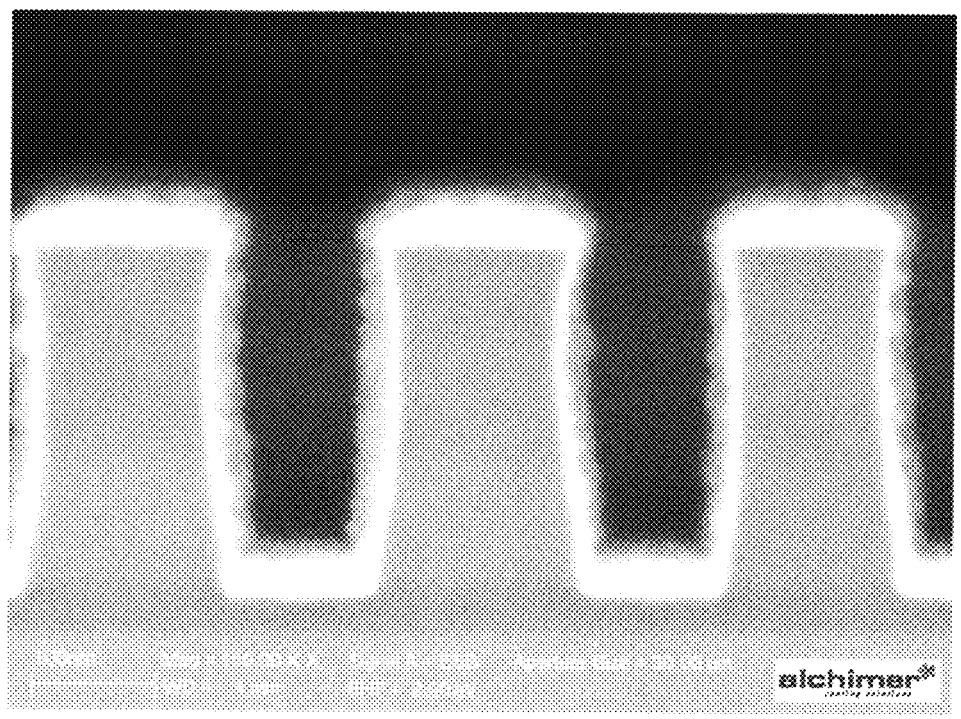
FIG. 1A and 1B are cross-sectional views of a copper seed layer on a barrier layer obtained in example 7 of the present application.

The copper complexing agents that can be used within the context of the present invention may be chosen from:
- primary aliphatic amines, in particular ethylamine, cyclohexylamine, ethylenediamine and cyclohexanediamine;
- secondary aliphatic amines, in particular pyrrolidine;
- tertiary aliphatic amines, in particular hydroxyethyldiethylamine and tetraethylenepentamine;
- aromatic amines, in particular 1,2-diaminobenzene and 3,5-dimethylaniline;
- nitrogen heterocycles, in particular pyridine, 2,2'-bipyridine, 8-hydroxyquinoline sulphonate, 1,10-phenanthroline, 3,5-dimethylpyridine and 2,2'-bipyrimidine; and
- oximes, in particular dimethylglyoxime.

In general, the nitrogen heterocycles that constitute one of the preferred classes of complexing agents that can be used within the context of the present invention may be defined as monocyclic or polycyclic compounds, whether fused or not, having 1 to 8 nitrogen atoms, each ring of which contains 5 to 6 members and may or may not be substituted with 1 to 8 atoms or groups of atoms chosen from halogens, hydroxyl and alkyl groups having from 1 to 6 carbon atoms.

The electroplating composition according to the invention may include one or more complexing agents.

It has been found that excellent results can be obtained with complexing agents capable of being adsorbed on a metal surface, resulting in ordered layers. Such agents, which constitute the copper complexing agents currently preferred according to the invention, are especially pyridine, 2,2'-bipyridine and the mixtures thereof, in particular mixtures in which the molar ratio between pyridine and 2,2'-bipyridine lies between 5:1 and 1:5, preferably between 3:1 and 1:1 and more preferably about 2:1.

Although in principle there is no restriction on the nature of the solvent (provided that it dissolves the active species of the solution sufficiently and does not interfere with the electroplating), water or a hydroalcoholic solution will be preferred.

In general, the electroplating composition according to the invention includes a source of copper ions, in particular cupric ($Cu^{2+}$) ions.

Advantageously, the source of copper ions is a copper salt such as in particular copper sulphate, copper chloride, copper nitrate or copper acetate, preferably copper sulphate.

According to one particular feature, the source of copper ions is present within the electroplating composition with a concentration of between 0.4 and 40 mM, preferably of between 0.4 and 18 mM and more preferably of between 0.4 and 15 mM.

Excellent results have been obtained with compositions in which the source of copper ions is present with a concentration of between 0.5 and 4 mM.

The copper ion source/copper complexing agent(s) molar ratio in the electroplating composition according to the invention is between 0.1 and 2.5, preferably between 0.3 and 1.3.

In general, the electroplating composition according to the invention has a pH of less than 7, preferably between 3.5 and 6.5.

The pH of the composition may optionally be adjusted within the aforementioned pH range by means of a buffer, such as one of those described in "Handbook of Chemistry and Physics", 84th edition, David R. Lide, CRC Press.

A currently preferred electroplating composition according to the invention comprises, in aqueous solution:
- copper sulphate, with a concentration of between 0.4 and 40 mM, preferably of between 0.4 and 18 mM and more preferably of between 0.4 and 15 mM;
- a mixture of pyridine and 2,2'-bipyridine as copper complexing agents;
- the copper/complexing agents molar ratio being between 0.3 and 1.3; and
- the pH of the said composition being less than 7, preferably between 3.5 and 6.5.

The electroplating compositions according to the invention may be employed in a standard electroplating method that includes bringing the surface of a substrate, such as in particular, the barrier layer preventing copper diffusion, into contact with an electrodeposition composition according to the invention and a step in which a coating is formed on said surface of the substrate during which the said surface is biased for a time long enough to form the said coating.

Embodiments involving more specific potential or current protocols may be preferred when it is desired for the coatings to have particular specifications, and especially coatings that are thin (with a thickness of less than 20 nm, and preferably less than 10 nm), adherent, conformal and uniform.

Surprisingly, it has been observed that excellent results in this regard may be obtained using the electroplating composition according to the invention by controlling, during the electroplating process, the conditions under which the surface to be coated is brought into contact with the said electroplating composition (or bath) prior to formation of the coating and the conditions under which this surface is removed from the said electroplating composition after formation of the coating.

It has been observed, quite unexpectedly, that it is possible, with the aforementioned electroplating compositions, to improve the adherence between the copper coating layer produced by electroplating and the barrier layer by bringing the surface to be coated into contact with the electroplating composition without being under electrical bias, that is to say without imposing an electric current or electric potential relative to a counterelectrode or relative to a reference electrode on this surface, prior to the electroplating step.

An even more substantial improvement in this adherence has been observed when the surface of the substrate to be coated is kept in contact with the electroplating composition for a period of at least 5 seconds after this contacting step and still prior to the electroplating step.

It has been found that the improvement in the adherence of the seed layer to the barrier layer makes it possible, surprisingly, to improve the adhesion of the "seed layer/fill layer or thick copper or thick layer" assembly, that is to say the "operational" adhesion of the assembly for which the seed layer is produced.

In general, it is difficult for the adhesion of a single seed layer to be measured directly, especially owing to its small thickness, but the results obtained have shown that the adhesion of the seed layers produced according to the present invention is obviously very high. The energy of adhesion of the "seed layer/fill layer or thick copper or thick layer" assembly to the barrier layer, which energy is the operational property of interest that it is actually to be optimized, is easier and more useful to determine. For example, this adhesion may be determined by peeling an adhesive tape bonded to the upper surface of the assembly, for example using a pulling test system. The adhesion measured in this way, or interfacial energy expressed in J/m², characterizes overall both the adherence of the seed layer to the barrier, and that of the thick copper layer to the seed layer. It does not give precise information about one or the other interface, but it does allow the desired operational property to be quantified, namely the strength of the copper/barrier interface. Consequently, in the present description, "adhesion of the seed layer", "adhesion of the thick copper layer to the seed layer" and the "strength of the copper/barrier interface after filling" will thus be used interchangeably.

It has also been observed, surprisingly, that it is possible to obtain a seed layer having a conductivity compatible with conventional electroplating filling methods, while keeping the coated surface under electrical bias, preferably for a time of between 1 and 10 seconds, preferably from a time of between 1 and 5 seconds, after its removal from the electroplating composition.

Thus, the electroplating compositions according to the invention will preferably be used in an electroplating method comprising:
- a step referred to as "cold entry" during which the said surface to be coated is brought into contact with an electroplating bath while the said surface is not under electrical bias, and preferably maintained in this state for a time of at least 5 seconds, preferably between 10 and 60 seconds and more preferably about 10 to 30 seconds;
- a step of forming the coating during which the said surface is biased for a time long enough to form the said coating; and
- a step referred to as "hot exit" during which the said surface is separated from the electroplating bath while it is still under electrical bias.

The combination of a "cold entry" step and a "hot exit" step in this method makes it possible to achieve better adhesion of the "seed layer/copper filling" assembly more easily and reproducibly.

In this method, the step of forming the coating by electroplating is carried out for a duration sufficient to form the desired coating. This duration may be easily determined by a person skilled in the art, the growth of the film being a function of the charge, which is equal to the time integral of the electric current flowing in the circuit over the deposition time (Faraday's law).

During the step of forming the coating, the surface to be coated is biased, either in galvanostatic mode (with a fixed set current) or in potentiostatic mode (with a fixed set potential, optionally relative to a reference electrode) or else in pulsed mode (either the current or the voltage being pulsed).

It is also possible to combine these modes, for example a step in potentiostatic mode followed by a step in galvanostatic mode.

In general, a satisfactory coating can be obtained by biasing in galvanostatic mode, preferably within the current range from 0.1 mA/cm² (milliamps per square centimetre) to 5 mA/cm², and more particularly from 0.1 mA/cm² to 1 mA/cm².

A satisfactory coating may also be obtained by biasing in potentiostatic mode, by imposing a cell voltage in such a way that the resulting cell current lies within the same current range as indicated previously (0.1 mA/cm2 to 5 mA/cm², and more particularly from 0.1 mA/cm² to 1 mA/cm²). Although the cell voltage depends in particular on cell design parameters, such as the distance from the counterelectrode or the presence of a membrane, it will be easy for a person skilled in the art to determine the cell voltage by measuring and adjusting the current obtained for a given potential and a given configuration.

A satisfactory coating may also be obtained by biasing in pulsed mode, preferably so as to impose voltage pulses.

In general, this step may be carried out by imposing voltage pulses corresponding to a maximum current per unit area within the range from 0.1 mA/cm² to 5 mA/cm², and more particularly from 0.1 mA/cm2 to 1 mA/cm², and to a minimum current per unit area within the range from 0 mA/cm² to 0.5 mA/cm², and more particularly from 0 mA/cm² to 0.1 mA/cm².

More particularly, the duration of bias at the maximum voltage may be between 0.15 and 5 seconds, for example around 2 seconds for a voltage corresponding to a maximum current per unit area of around 0.5 mA/cm², whereas the duration of bias at the minimum voltage may be between 0.15 and 7 seconds, for example around 3 seconds, for a voltage corresponding to a minimum current per unit area of around 0.05 mA/cm².

The number of cycles to be performed during this step depends on the desired thickness of the coating.

In general, a person skilled in the art will readily determine the number of cycles to be performed knowing that, under the aforementioned general conditions, illustrated by the examples below, it has been observed that the deposition rate is about 0.1 nm per cycle.

The latter method of implementing the invention has been used in particular to produce copper seed layers on highly resistive substrates, the sheet resistance of which may be up to 100 000 ohms/square, or even a few megohms/square.

Advantageously, the abovementioned "hot exit" step is carried out in potentiostatic mode, that is to say by keeping the electric potential of the coated substrate (wafer) at a fixed value, this potential being measured either relative to the counterelectrode of the circuit or relative to a reference electrode, preferably at the same voltage level as during the coating deposition step when this is also carried out in potentiostatic mode.

A second object of the present invention is the use of electroplating compositions described above for coating a copper-diffusion barrier layer in the fabrication of interconnects for integrated circuits.

In this aspect, the present invention also encompasses a method of coating a surface of a substrate, such as an particular a barrier layer preventing copper diffusion, which comprises bringing the said surface into contact with an electrodeposition composition as described above and a step during which the said surface is biased during a sufficient period to form the said coating.

According to a particular embodiment, the barrier layer preventing copper diffusion comprises at least one material chosen among tantalum nitride, tantalum, ruthenium, cobalt, tungsten, titanium nitride, examples of specific barrier surfaces being ones consisting of a tantalum nitride/tantalum bilayer or a ruthenium layer.

This coating method is especially useful for the preparation of a copper seed layer having a very low thickness of the order of 30 nm or less, for example of the order of 10 nm or less, on a barrier layer preventing copper diffusion as defined above.

The present invention will now be illustrated by the following non-limiting examples in which the compositions according to the invention are used to deposit a copper seed layer on silicon substrates coated with a copper-diffusion barrier layer. These examples are especially applicable in the fabrication of copper interconnect structures for integrated circuits.

EXAMPLE 1

Deposition of a Copper Seed Layer on a TaN/Ta Barrier Layer Using a Composition According to the Invention Based on a Mixture of 2,2'-bipyridine and Pyridine

A. Apparatus and Equipment

Substrate

The substrate used in this example consisted of a 200 mm diameter silicon wafer covered with a silica layer having a thickness of 400 nm, itself coated with a tantalum nitride (TaN) layer having a thickness of 15 nm deposited by reactive sputtering and with a tantalum (Ta) layer having a thickness of 10 nm, also deposited by sputtering.

This TaN/Ta "bilayer" constitutes a copper-diffusion barrier as used in "double damascene" structures in the fabrication of copper interconnects for integrated circuits.

Electroplating Solution

The electroplating solution used in this example was an aqueous solution containing: 0.3 g/l (or 1.7 mM) of 2,2'-bipyridine; 0.6 g/l (or 2.4 mM) of $CuSO_4.5H_2O$; and 0.3 ml/l (or 3.3 mM) of pyridine. The pH of the solution was between 5.8 and 6.2.

Equipment

In this example, an electroplating deposition equipment representative of that employed in the microelectronics industry, model Equinox™ from Semitool®, capable of processing 200 mm wafers was used.

This equipment comprised an electroplating deposition cell in which the seed layer was deposited and a rinse/dry station used after deposition.

The electroplating deposition cell comprised an anode, made either of an inert metal (for example platinum-coated titanium) or of a metal identical to that constituting the seed layer, in this case copper, the silicon wafer coated with the TaN/Ta barrier layer constituting the cathode of this cell.

This cell also included a stabilized power supply for delivering up to 30 V and 4 A and a device for electrically contacting the cathode, physically isolated from the solution by a seal. This electrical contacting device generally had a ring shape and allowed the substrate to be biased at various contact points placed uniformly around the said substrate.

It also included a device for supporting the wafer to be coated, including means for rotating the said wafer at a predetermined speed.

B. Experimental Protocol

The electroplating method used in this example comprised the following various consecutive steps.

Step 1

"Cold Entry"

This step was divided into two substeps:

1.1.

The aforementioned substrate was introduced into the electroplating deposition cell so that the face having the TaN/Ta barrier layer came into contact with the electrical contacting device, the latter not yet being electrically powered.

1.2.

The assembly formed by the electrical contacting device and the substrate, which hereafter will be referred as the "cathode assembly", was bought into contact, for example by immersion, with the electroplating solution. This contacting step, generally lasting 5 seconds or less (for example 2 seconds), was carried out while the device was still not electrically powered. The cathode assembly was preferably then kept in the electroplating solution without being biased for a period of at least 5 seconds (for example around 30 seconds).

Step 2

Formation of the Copper Coating

The cathode assembly was then biased in potentiostatic mode by imposing a cell voltage corresponding to a current per unit area of generally between 0.4 $mA/cm^2$ and 0.8 $mA/cm^2$ (for example 0.6 $mA/cm^2$) and at the same time rotated at a speed of 20 to 60 rounds per minute (for example 40 rounds per minute).

The duration of this step depended, as will have been understood, on the targeted thickness of the seed layer. This duration can be easily determined by a person skilled in the art, the growth of the film depending on the charge passed in the circuit.

Under the aforementioned conditions, the deposition rate was about 1 nm per coulomb of charge passed in the circuit.

In this example, the duration of the electroplating step was around 50 seconds for obtaining a coating having a thickness of 10 nm, and around 200 seconds for obtaining a coating having a thickness of 40 nm.

Step 3

"Hot Exit"

This step may be divided into two substeps:

3.1.

After the electroplating step, the copper-coated cathode assembly was withdrawn from the electroplating solution with a zero speed of rotation, while being maintained under voltage bias. The duration of this phase was about 2 seconds.

The speed of rotation was then increased to 500 rounds per minute for 10 seconds, the cathode assembly bias being cut off during this final phase.

A pre-rinse with deionized water was carried out in the cell.

3.2.

The substrate coated with the seed layer was then transferred into the rinsing/drying module in order to be rinsed with deionized water.

The rinsing water was then removed, and then a drying operation under a stream of nitrogen was carried out.

The rotation was then stopped so as to allow the dried coated substrate to be removed.

In this example, the exit step, and in particular the removal of the cathode assembly from the electroplating solution, was carried out under voltage bias at the same level as during the step of forming the coating.

C. Results Obtained

By applying the experimental protocol described above, copper layers of 10 nm, 20 nm and 40 nm in thickness exhibiting excellent conformality, adhesion and resistance characteristics were obtained.

Conformality was assessed by observing scanning electron microscope cross sections and comparing the thickness of the seed layer on the horizontal surfaces with that on the vertical surfaces.

The sheet resistance was measured using a "4-point" measurement instrument well known to those skilled in the art.

The adhesion or interfacial energy was measured after electrochemical deposition of a 500 nm thick copper layer (plating layer) on the seed layer. This measurement was carried out using an apparatus (pulling test system) that applied an increasing vertical pulling force on the surface via a strong adhesive tape until the copper layer (seed layer and plating layer) separates from the substrate. The work of this force (force multiplied by length of the layer that has delaminated) is equivalent to the energy that had to be supplied in order to separate the copper layer from its substrate. By dividing this energy by the area that has delaminated, the energy per unit area is obtained.

Some of the results of the measurements are given in Table 1 below.

EXAMPLE 2

Deposition of a Copper Seed Layer on a TaN/Ta Barrier Layer Using a Composition According to the Invention Based on 2,2'-bipyridine A. Apparatus and Equipment Substrate The substrate used in this example consisted of a silicon coupon 6 cm in length and 2 cm in width, coated with a silica layer having a thickness of 400 nm, itself coated with a tantalum nitride (TaN) layer having a thickness of 15 nm deposited by reactive sputtering and with a tantalum (Ta) layer having a thickness of 10 nm deposited by sputtering.

This TaN/Ta "bilayer" constitutes a copper-diffusion barrier as used in "double damascene" structures in the fabrication of the copper interconnects for integrated circuits.

Electroplating Solution

The electroplating solution used in this example was an aqueous solution containing $CuSO_4.5H_2O$ and 2,2'-bipyridine.

In this solution, the copper/complexing agent (2,2'-bipyridine) molar ratio varied between 0.1 and 2.5 (for example 1.4) with a $CUSO_4$ $(H_2O)_5$ concentration of 0.2 g/l (or 0.8 mM) for example. The pH of the solution was between 4.5 and 5.

Equipment

This example used a glass electroplating cell made up of two parts: the cell intended to contain the electroplating solution and a "cover" for maintaining the various electrodes in operative position.

The electroplating cell had three electrodes:

an inert metal (platinum) anode;
the silicon coupon coated with the TaN/Ta layer, constituting the cathode, and
an $Ag/AgClO_4$ reference electrode.

Connectors are used to bring into electrical contact the electrodes which are linked via electrical wires to a potentiostat supplying up to 10V and 2 A.

B. Experimental Protocol

The electroplating method used in this example comprised the following various consecutive steps.

Step 1 "Hot Entry"

The electroplating solution was poured into the cell.

The various electrodes were placed on the cover of the electroplating cell.

The electrodes were brought into contact with the electroplating solution under bias.

Step 2 Formation of the Copper Coating

The cathode was biased either in galvanostatic mode, within a current range from 1 mA (or 0.125 $mA/cm^2$) to 4 mA (or 0.5 $mA/cm^2$) (for example 2 mA (or 0.25 $mA/cm^2$)), or in potentiostatic mode in a potential range from 2 V to 5 V (for example 2 V), or in cyclic voltammetry mode with a potential ramp ranging within a range of potentials from 2 V to 5 V (for example 2 V), a sweep speed of between 20 and 500 mV/s (for example 50 mV/s) and a number of cycles between 2 and 10 (for example 2).

Degassing with argon may be employed—it allows some hydrodynamic regime to be established in the cell.

The duration of this step depended on the electrochemical deposition mode used (galvanostatic or cyclic voltametry mode). In general, it was between 2 and 15 minutes. For the same deposition mode, this duration depends on the targeted thickness of the seed layer and can be easily determined by a person skilled in the art, the growth of the film being a function of the charge passed in the circuit.

Under the aforementioned conditions, the deposition rate was about 31 nm per coulomb of charge passed in the circuit.

In this example, the duration of the electroplating step in cyclic voltammetry mode was about 480 s in order to obtain a coating having a thickness of about 30 nm.

Step 3 "Cold Exit"

The bias was removed, the electrodes still being in contact with the solution.

The cathode was then disconnected, and thoroughly rinsed with 18 MΩ deionized water, then dried using an argon gun with a gas pressure of around 2 bar.

C. Results Obtained

By applying the experimental protocol described above in cyclic voltammetry mode, continuous conformal copper layers were obtained (this being observed under a scanning electron microscope) with thickness of 20 nm, 30 nm, and 40 nm.

The copper seed layer, having a thickness of 30 nm, had a sheet resistance of 4 ohms/square measured by the method described in Example 1.

EXAMPLE 3

Deposition of a Copper Seed Layer on a TaN/Ta Barrier Layer Using a Composition According to the Invention Based on a Mixture of 2,2'-bipyridine and Pyridine A. Apparatus and Equipment Substrate The substrate used in this example was identical to that of Example 2.

Solution

The solution used in this example was an aqueous solution containing 2,2'-bipyridine, pyridine and $CuSO_4$ $(H_2O)_5$. The copper/complexing agents (2,2'-bipyridine and pyridine) molar ratio varied between 0.1 and 2.5 (for example 0.5) with a $CUSO_4$ $(H_2O)_5$ concentration of 0.2 g/l (or 0.8 mM) for example, for mass concentrations of the two complexing agents of the same order of magnitude. The pH of the solution was between 5.8 and 6.2.

Equipment

The equipment used in this example was identical to that of Example 2.

B. Experimental Protocol

The protocol used in this example was identical to that of Example 2.

C. Results Obtained

By applying this experimental protocol in cyclic voltammetric mode, continuous conformal copper layers (observed under a scanning electron microscope) were obtained with thickness of 10 nm, 20 nm and 40 nm.

The copper seed layers, having a thickness of 20 nm and 10 nm, had a sheet resistance of 8 ohms/square and 18 ohms/square respectively, measured by the method described in Example 1.

EXAMPLE 4

Deposition of a Copper Seed Layer on a TaN/Ta Barrier Layer Using a Composition According to the Invention Based on a Pyridine Derivative A. Apparatus and Equipment Substrate The substrate used in this example was identical to that of Example 2.

Solution

The solution used in this example was an aqueous solution containing 3,5-dimethylpyridine and $CuSO_4$ $(H_2O)_5$. The copper/complexing agent (3,5-dimethylpyridine) molar ratio varied between 0.1 and 2.5 (Example 1) with a CUSO$_4$ (H$_2$O)$_5$ concentration of 0.2 g/l (or 0.8 mM) for example. The pH of the solution was between 4.5 and 5.

Equipment

The equipment used in this example was identical to that of Example 2.

B. Experimental Protocol

The protocol used in this example was identical to that of Example 2.

C. Results Obtained

By applying this experimental protocol in galvanostatic mode, continuous conformal copper layers (observed under a scanning electron microscope) were obtained with thickness of 25 nm and 35 nm.

The copper seed layers, having a thickness of 25 nm and 35 nm, had a sheet resistance of 5 ohms/square and 4 ohms/square respectively, measured by the method described in Example 1.

EXAMPLE 5

Deposition of a Copper Seed Layer on a TaN/Ta Barrier Layer Using a Composition According to the Invention Based on an Aliphatic Polyamine A. Apparatus and Equipment Substrate The substrate used in this example was identical to that of Example 2.

Solution

The solution used in this example was an aqueous solution containing tetraethylpentamine with a concentration of 0.36 g/l (or 1.9 mM) and CUSO$_4$ (H$_2$O)$_5$ with a concentration of 0.6 g/l (or 2.4 mM). The copper/complexing agent (tetraethylpentamine) molar ratio was 1.26, but could vary between 0.1 and 2.5, for example with a CuSO$_4$ (H$_2$O)$_5$ concentration of 0.6 g/l. The pH of the solution was 5.1.

Equipment

The equipment used in this example was identical to that of Example 2.

B. Experimental Protocol

The electroplating method used in this example comprised the following various consecutive steps.

Step 1 "Cold Entry"

The electroplating solution was poured into the cell.

The various electrodes were placed on the cover of the electroplating cell.

The electrodes were brought into contact with the electroplating solution. At this stage, the assembly thus formed was not yet electrically biased (it was at its open-circuit potential).

The assembly was maintained in this state (i.e. under no electrical bias) for a period of 10 to 60 seconds (for example 30 seconds).

Step 2 Formation of the Copper Coating

The cathode was biased in galvanostatic mode within the current range from 2 mA (or 0.25 mA/cm$^2$) to 8 mA (or 1 mA/cm$^2$) (for example 6 mA (or 0.75 mA/cm$^2$)).

Degassing with argon may be employed—it allows some hydrodynamic regime to be established in the cell.

The duration of this step depended on the targeted thickness of the seed layer and could easily be determined by a person skilled in the art, the growth of the film being a function of the charge passed in the circuit.

Under the aforementioned conditions, the deposition rate was about 33 nm per coulomb of charge passed in the circuit.

In this example, the duration of the electroplating step was about 200 seconds in order to obtain a coating having a thickness of about 40 nm.

Step 3 "Hot Exit"

The cathode was then removed from the solution, the bias still being applied.

The cathode was then disconnected, and thoroughly rinsed with 18 MΩ deionized water, then dried using an argon gun with a gas pressure of around 2 bar.

C. Results Obtained

By applying the experimental protocol described above, continuous conformal copper layers 30 nm and 40 nm in thickness were obtained (observed under a scanning electron microscope).

The copper seed layer, having a thickness of 40 nm, had a sheet resistance of 8 ohms/square measured by the method described in Example 1.

EXAMPLE 6

Deposition of a Copper Seed Layer on a Ru Barrier Layer Using a Composition According to the Invention Based on a Mixture of 2,2'-bipyridine and Pyridine Substrate The substrate used in this example consisted of a silicon coupon 6 cm in length by 2 cm in width, coated with a silica layer having a thickness of 400 nm, itself coated with a ruthenium (Ru) layer having a thickness of 30 nm deposited by sputtering. The sheet resistance of this substrate was 7.5 ohms/square.

This Ru layer may constitute a copper-diffusion barrier as used in "double damascene" structures in the fabrication of cover interconnects for advanced integrated circuits.

Solution

The solution used in this example was identical to that of Example 1.

Equipment

The equipment used in this example was identical to that of Example 2.

B. Experimental Protocol

The electroplating method used in this example was identical to that of Example 5.

C. Results Obtained

By applying the experimental protocol described above, a continuous conformal copper layer 40 nm in thickness was obtained (observed under a scanning electron microscope).

This copper seed layer had a sheet resistance of 2.5 ohms/square measured by the method described in Example 1.

EXAMPLE 7

Deposition of a Copper Seed Layer on a TaN/Ta Barrier Layer Using a Composition According to the Invention Based on a Mixture of 2,2'-bipyridine and Pyridine A. Apparatus and Equipment Substrate The substrate used in this example is identical to the one used in example 1.

Electroplating Solution

The electroplating solution used in this example was an aqueous (de-ionized water 18.2 Mohm.cm) solution prepared in a cleanroom environment (class 10,000 or ISO 7) containing: 0.4 g/l (or 2.56 mM) of 2,2'-bipyridine (purity 99.7%) supplied by Oxkem; 0.8 g/l (or 3.2 mM) of $CuSO_4.5H_2O$ (purity 99.995%) supplied by Alfa Aesar; and 0.367 ml/l (or 4 mM) of pyridine (purity 99.9%) supplied by Aldrich.

After preparation, the solution was filtered at 0.2 μm. The pH of the solution was 5.94.

Equipment

The equipment used in this example is identical to the one used in example 1.

B. Experimental Protocol

The electroplating method used in this example is identical to the one used in example 1.

C. Results Obtained

By applying the above experimental protocol, copper layers of 10 nm and 20 nm in thickness exhibiting excellent conformality (see FIGS. 1A. and 1B. below), adhesion and resistance characteristics were obtained.

Figure 1B:
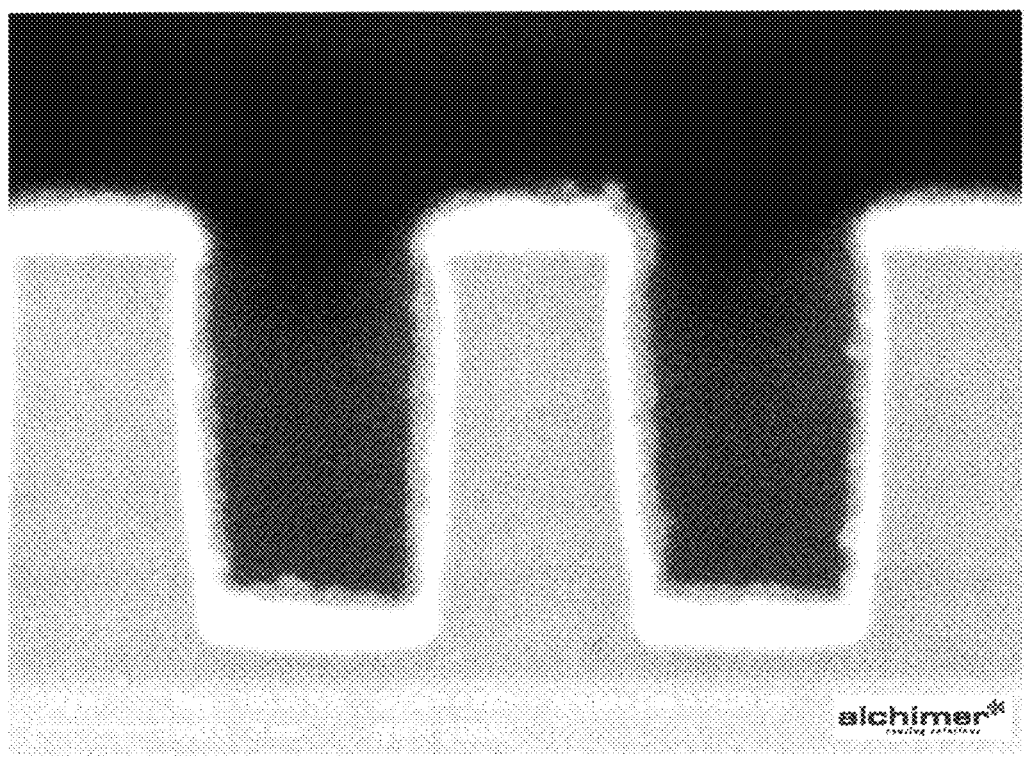

The excellent conformality characteristics of this layer are illustrated in FIGS. 1a and 1b which represent cross-sectional view in backscattered electrons mode enhancing chemical contrast.

Conformality over trenches was also characterized on a large scale (0.01 mm$^2$) using scatterometry. These measurements showed a copper layer thickness of 7 nm at the top, bottom and sidewalls of trenches and they are in good agreement with actual thicknesses observed by SEM cross-sections.

Except for scatterometry, all characterization methods are identical to the ones used in example 1.

Table 1 below gives the results obtained in the above Examples 1 to 7. Similar trends were also observed for the sheet resistance before treatment of a few hundred ohms/square, or several tens of thousands of ohms/square or even up to a few megohms/square.

TABLE 1

| Copper seed layer obtained according to: | Thickness (nm) | Sheet resistance (ohms/square) | | Adhesion (J/m$^2$) |
| --- | --- | --- | --- | --- |
| | | Before treatment | After treatment | |
| Example 1 | 20 | 23 | 8 | 11 to 13 |
| Example 1 | 10 | 23 | 18 | 11 to 13 |
| Example 2 | 30 | 23 | 4 | 3 to 5 |
| Example 3 | 20 | 23 | 8 | 5 to 7 |
| Example 3 | 10 | 23 | 18 | 5 to 7 |
| Example 4 | 25 | 23 | 4 | 1 to 3 |
| Example 4 | 35 | 23 | 5 | 1 to 3 |
| Example 5 | 40 | 23 | 8 | <1 |
| Example 6 | 40 | 7.5 | 2.5 | >20 |
| Example 7 | 20 | 22 | 5.3 | >20 |
| Example 7 | 10 | 21 | 15 | >20 |

The invention claimed is:

1. An electroplating composition in solution form suitable for providing a copper coating on a copper-diffusion barrier layer in the fabrication of interconnects for integrated circuits, comprising:
   a solvent;
   a source of cupric ions, in a concentration between 0.4 and 18 mM; and
   a mixture of pyridine and 2,2'-bipyridine as complexing agents for the cupric ions;
   a molar ratio of the cupric ion/the complexing agents being between 0.1 and 2.5;
   the cupric ions forming a complex with the complexing agents in the solution; and
   the pH of the composition being in a range suitable for the pyridine and bipyridine to be in an unprotonated state and not higher than 6.5.

2. The composition according to claim 1, wherein the concentration of the source of cupric ions is between 0.4 and 15 mM.

3. The composition according to claim 1, wherein the cupric ions/complexing agents molar ratio is between 0.3 and 1.3.

4. The composition according to claim 1, wherein the solvent is selected from water and hydroalcoholic mixtures.

5. The composition according to claim 1, wherein the source of copper ions is a copper salt.

6. The composition according to claim 5, wherein the copper salt is selected from copper sulphate, copper chloride, copper nitrate and copper acetate.

7. The composition according to claim 6, wherein the copper salt is copper sulphate.

8. The composition according to claim 1, wherein the molar ratio between pyridine and 2,2'-bipyridine is between 5:1 and 1:5.

9. The composition according to claim 1, wherein the molar ratio between pyridine and 2,2'-bipyridine is between 3:1 and 1:1.

10. The composition according to claim 1, wherein the composition comprises a complex of the cupric ions with the pyridine and the 2,2'-bipyridine.

11. A method of providing a copper coating onto a barrier layer that prevents copper diffusion in fabricating interconnects for integrated circuits, the method comprising bringing the barrier layer under electrical bias into contact with the composition according to claim 1.

12. The method according to claim 11,
   wherein an adhesion value of a copper seed layer is higher than 5 J/M$^2$, and
   the copper coating has a thickness of less than 20 nm.

* * * * *